United States Patent
Nakazawa et al.

(10) Patent No.: US 11,639,950 B2
(45) Date of Patent: May 2, 2023

(54) CURRENT SENSOR

(71) Applicant: HIOKI E.E. CORPORATION, Ueda (JP)

(72) Inventors: Koki Nakazawa, Ueda (JP); Yuki Karasawa, Ueda (JP); Kenta Ikeda, Ueda (JP); Kimihiko Yamagishi, Ueda (JP); Takafumi Maruyama, Ueda (JP)

(73) Assignee: HIOKI E.E. CORPORATION, Ueda (JP)

(*) Notice: Subject to any disclaimer, the term of this patent is extended or adjusted under 35 U.S.C. 154(b) by 0 days.

(21) Appl. No.: 17/192,211

(22) Filed: Mar. 4, 2021

(65) Prior Publication Data

US 2021/0278443 A1 Sep. 9, 2021

(30) Foreign Application Priority Data

Mar. 6, 2020 (JP) .............................. JP2020-039014
Jan. 7, 2021 (JP) .............................. JP2021-001731

(51) Int. Cl.
*G01R 15/18* (2006.01)
*G01R 19/00* (2006.01)

(52) U.S. Cl.
CPC ....... *G01R 15/183* (2013.01); *G01R 19/0092* (2013.01)

(58) Field of Classification Search
CPC .. G01R 15/183; G01R 15/207; G01R 15/185; G01R 15/202; G01R 33/0076; G01R 33/04

See application file for complete search history.

(56) References Cited

U.S. PATENT DOCUMENTS 4,914,381 A 4/1990 Narod et al.
6,411,078 B1 6/2002 Nakagawa et al.
(Continued)

FOREIGN PATENT DOCUMENTS

CN 109727760 A 5/2019
CN 110412336 A 11/2019
(Continued)

OTHER PUBLICATIONS

Yang et al., "Design and Realization of a Novel Compact Fluxgate Current Sensor", IEEE Transactions on Magnetics, vol. 51, No. 3, Mar. 1, 2015, 4 Pages, IEEE Service Center, New York, USA.
(Continued)

*Primary Examiner* — Dominic E Hawkins
(74) *Attorney, Agent, or Firm* — Jordan IP Law, LLC

(57) ABSTRACT

A current sensor for detecting a magnitude of a current flowing through a measuring object has a magnetic core having a first magnetic core and a second magnetic core that is arranged magnetically in parallel to the first magnetic core, wherein the first magnetic core has a magnetic permeability that is higher than that of the second magnetic core in a first frequency band, and the first magnetic core has a magnetic permeability that is lower than that of the second magnetic core in a second frequency band, the second frequency band being higher than the first frequency band, and the current sensor detects the magnitude of the current in a frequency band that is constituted by combining the first frequency band and the second frequency band.

14 Claims, 13 Drawing Sheets

(56) References Cited

U.S. PATENT DOCUMENTS

| | | | | |
|---|---|---|---|---|
| 8,421,444 | B2* | 4/2013 | Gunn | G01R 15/185 |
| | | | | 323/357 |
| 2002/0008512 | A1 | 1/2002 | Logue et al. | |
| 2003/0201873 | A1* | 10/2003 | Cern | H01R 13/6666 |
| | | | | 307/104 |
| 2008/0048643 | A1 | 2/2008 | Delevoye et al. | |
| 2011/0156697 | A1* | 6/2011 | Gunn | G01R 15/185 |
| | | | | 324/127 |
| 2016/0284459 | A1* | 9/2016 | Ishigaki | H01F 30/16 |
| 2017/0125151 | A1* | 5/2017 | Hamamura | H01F 27/29 |
| 2018/0120357 | A1* | 5/2018 | Takenaka | G01R 15/185 |

FOREIGN PATENT DOCUMENTS

| | | |
|---|---|---|
| JP | 5313024 B2 | 10/2013 |
| WO | 2013145284 A1 | 10/2013 |

OTHER PUBLICATIONS

Yang et al.,"Design and development of a current sensor with temperature stability and high resolution", 2016 IEEE Conference on Electromagnetic Field Computation (CEFC), IEEE, Nov. 13, 2016, 1 Page.

Yang et al., "A New Compact Fluxgate Current Sensor for AC and DC Application", IEEE Transactions on magnetics, vol. 50, No. 11, Nov. 1, 2014, 4 Pages, IEEE Service Center, New York, NY, USA.

D. W. Lee et al., "Fabrication and Performance of Integrated Fluxgate for Current Sensing Applications," IEEE Transactions on Magnetics, vol. 53, No. 11, Nov. 1, 2017, 4 Pages, IEEE Service Center, New York, NY, USA.

E. E. Lesniewska et al., "Application of the Field-Circuit Method for the Computation of Measurement Properties of Current Transformers With Cores Consisting of Different Magnetic Materials," IEEE Transactions on Magnetics, vol. 46, No. 10, Oct. 1, 2010, pp. 3778-3782, IEEE Service Center, New York, NY, USA.

* cited by examiner

CURRENT SENSOR

CROSS-REFERENCE TO RELATED APPLICATION

The present application claims priority 35 U.S.C. § 119 to Japanese Patent Application 2020-039014 (filed Mar. 6, 2020) and Japanese Patent Application 2021-001731 (filed on Jan. 7, 2021), which are hereby incorporated by reference in their entirety.

TECHNICAL FIELD

The present invention relates to a current sensor.

BACKGROUND ART

JP5313024B discloses a through-type current sensor for detecting a magnitude of a current flowing through a measuring object. The through-type current sensor includes a fluxgate sensor element having an annular shape, a small diameter permalloy case formed to have a U-shaped cross-section and accommodating the fluxgate sensor element, and a large diameter permalloy case formed to have a U-shaped cross-section and covering an opening of the small diameter permalloy case.

SUMMARY OF INVENTION

The current sensor is required to have a measurement accuracy such that the current sensor outputs the same measurement values, when a measuring object locates at any positions in the inner circumference of a magnetic core. Because the current sensor disclosed in JP5313024B has the permalloy case, the accuracy for measuring the current is high when the frequency of the current is relatively low, however the accuracy for measuring the current is not high, when the frequency of the current is relatively high. As described above, it is difficult to improve the accuracy for measuring the current in a wide frequency band.

The present invention has been made in view of the above-mentioned problems, and an object of the present invention is to improve the accuracy for measuring a current in a wide frequency band by a current sensor.

According to an aspect of the present invention disclosure, a current sensor for detecting a magnitude of a current flowing through a measuring object has a magnetic core having a first magnetic core and a second magnetic core that is arranged magnetically in parallel to the first magnetic core, wherein the first magnetic core has a magnetic permeability that is higher than that of the second magnetic core in a first frequency band, and the first magnetic core has a magnetic permeability that is lower than that of the second magnetic core in a second frequency band, the second frequency band being higher than the first frequency band, and the current sensor detects the magnitude of the current in a frequency band that is constituted by combining the first frequency band and the second frequency band.

In this aspect, the magnetic core has the first magnetic core and the second magnetic core which are arranged magnetically in parallel. In the first frequency band where the frequency of the current flowing through the measuring object is relatively low, the magnetic permeability of the first magnetic core is higher than that of the second magnetic core. In the second frequency band higher than the first frequency band, the magnetic permeability of the second magnetic core is higher than that of the first magnetic core. Therefore, the accuracy for measuring the current can be improved by the first magnetic core in the first frequency band, and the accuracy for measuring the current can be improved by the second magnetic core in the second frequency band. Therefore, it is possible to improve the accuracy for measuring the current in a wide frequency band by the current sensor.

DESCRIPTION OF EMBODIMENTS

First Embodiment

Hereinafter, a current sensor 100 according to a first embodiment of the present invention will be described with reference to the accompanying drawings.

Figure 1:
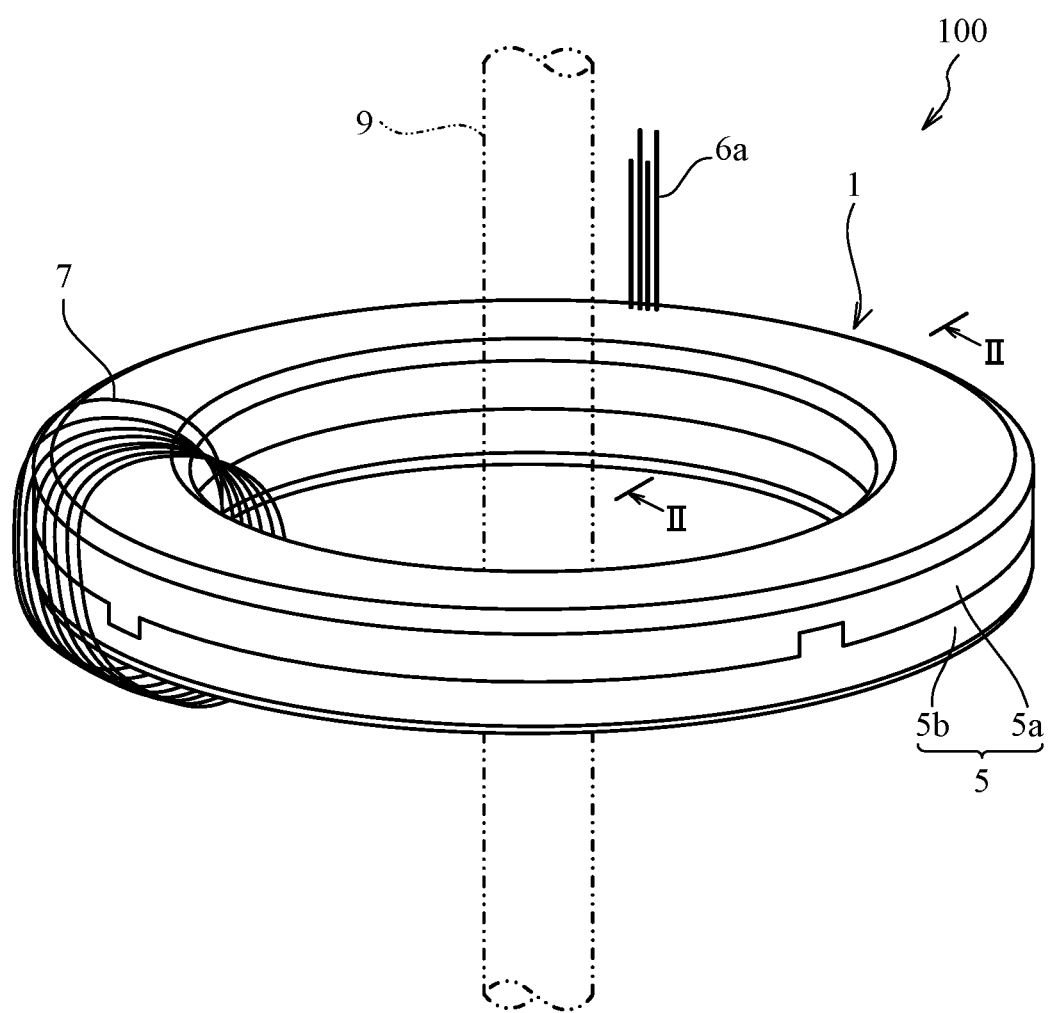
FIG. 1 is a perspective view of a current sensor according to a first embodiment of the present invention.
Figure 2:
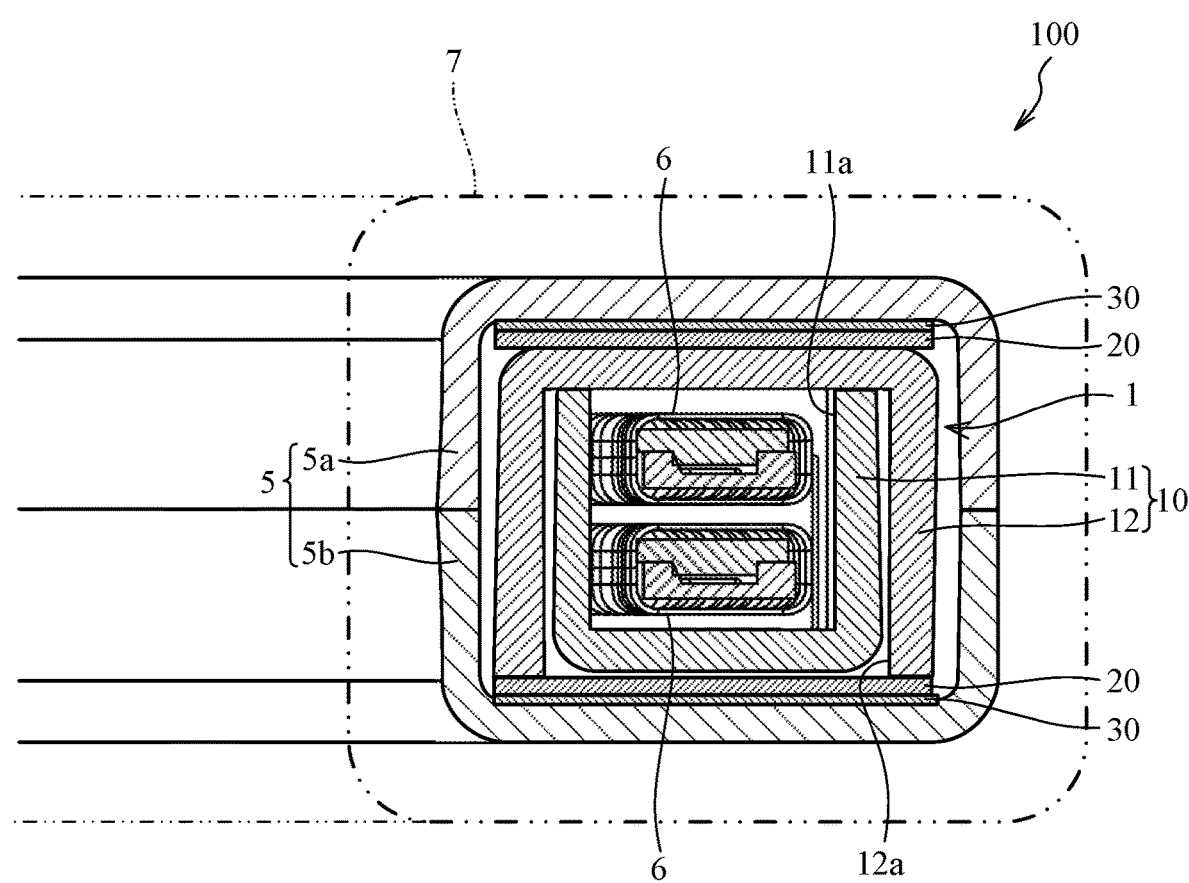
FIG. 2 is a II-II cross-sectional view in FIG. 1.
Figure 3A:
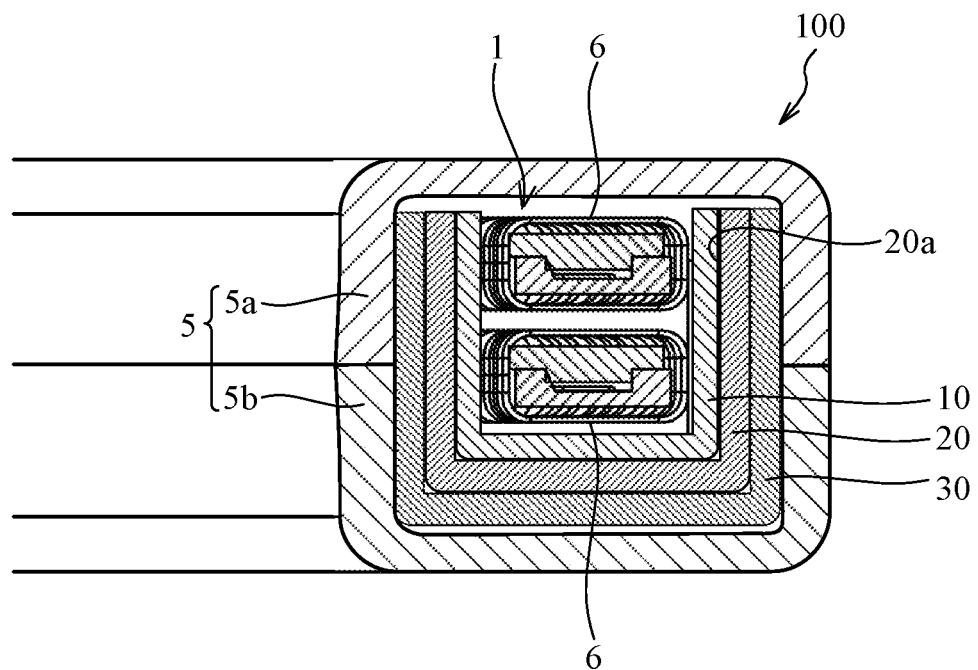
FIG. 3A is a cross-sectional view of a magnetic core according to a modification.
Figure 3B:
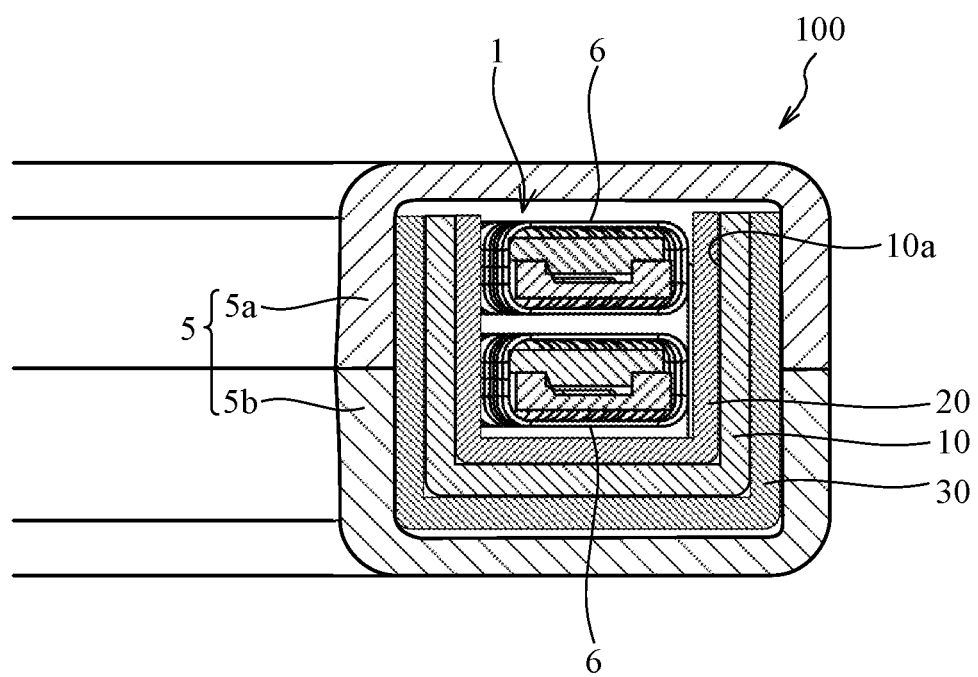
FIG. 3B is a cross-sectional view of the magnetic core according to another modification.
Figure 4:
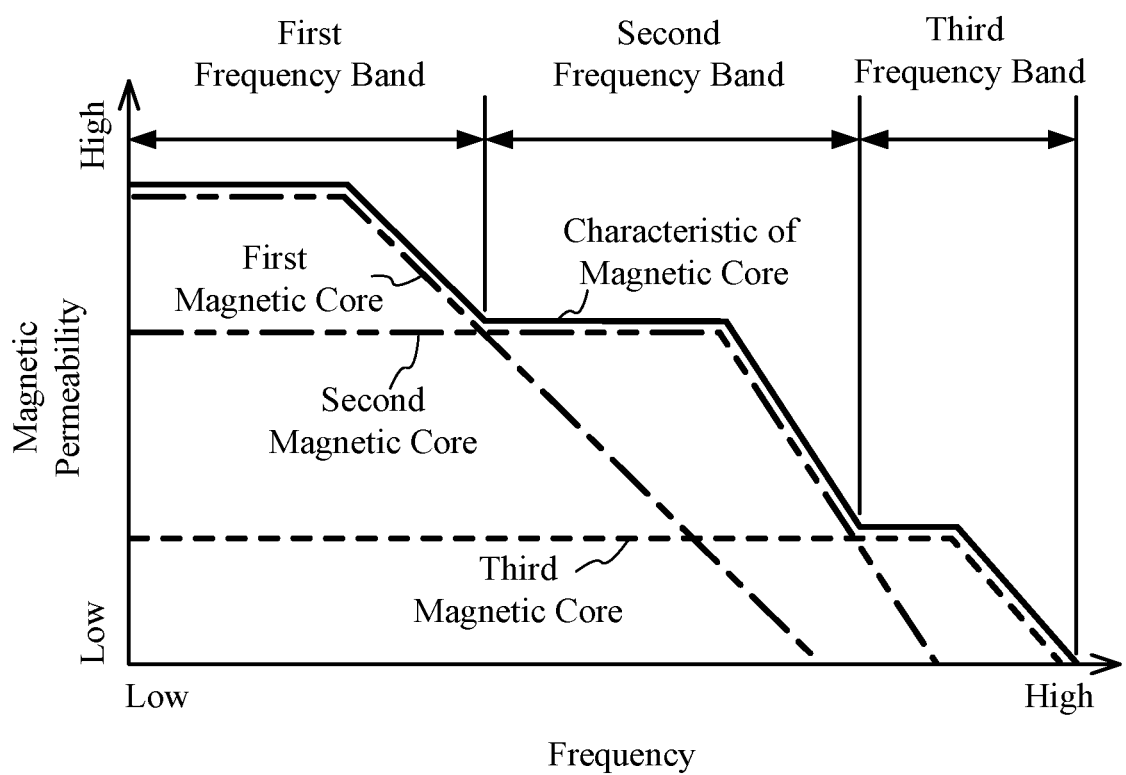
FIG. 4 is a diagram for explaining a relation between a frequency and a magnetic permeability in the magnetic core.

First, the entire configuration of current sensor 100 will be described by referring to FIG. 1 to FIG. 4. FIG. 1 is a perspective view of a current sensor. FIG. 2 is a II-II cross-sectional view in FIG. 1. FIG. 3A is a cross-sectional view of a magnetic core according to a modification. FIG. 3B is a cross-sectional view of a magnetic core according to another modification. FIG. 4 is a diagram for explaining a relation between a frequency and a magnetic permeability in the magnetic core. In FIG. 4, a horizontal axis represents a frequency of a current flowing in a measuring object 9, and a vertical axis represents a magnetic permeability.

As shown in FIG. 1 and FIG. 2, the current sensor 100 includes a magnetic core 1, a cover 5 containing the magnetic core 1, a fluxgate sensor 6 as a magnetic detection element, and a winding 7. The current sensor 100 is a through-type current sensor for measuring a magnitude of a current flowing in a measuring object 9 in a state where the current sensor 100 surrounds the measuring object 9 (see FIG. 1). The current sensor 100 detects a magnitude of the current in a frequency band in which a first frequency band, a second frequency band that is higher than the first frequency band, and a third frequency band that is higher than the second frequency band are combined, as described below.

As shown in FIG. 1, the magnetic core 1 is formed in a ring shape, a torus shape in this embodiment. At the time of measuring the current, the measuring object 9 is inserted through an inner periphery of the magnetic core 1. As shown in FIG. 2, the magnetic core 1 includes a first magnetic core 10, a second magnetic core 20, and a third magnetic core 30. The first magnetic core 10, the second magnetic core 20, and the third magnetic core 30 are arranged magnetically in parallel.

The first magnetic core 10 is made of permalloy, which is an iron nickel soft magnetic material. The first magnetic core 10 is formed in the torus shape. The first magnetic core 10 has a small diameter case 11 and a large diameter case 12.

The small diameter case 11 is formed to have a U-shaped cross-section. The small diameter case 11 has an opening 11a having a torus shape that opens to allow the fluxgate sensor 6 to be inserted. The small diameter case 11 accommodates a pair of a fluxgate sensor 6.

The large diameter case 12 is formed to have a U-shaped cross-section that is larger than small diameter case 11. The large diameter case 12 has an opening 12a having a torus shape that opens to allow the small diameter case 11 to be inserted. The large diameter case 12 is assembled with the small diameter case 11 by moving the opening 12a from an opposite position to the opening 11a of the small diameter case 11 along a central axial direction of magnetic core 1. The large diameter case 12 closes the opening 11a of the small diameter case 11 in a state that the large diameter case 12 is assembled with the small diameter case 11. With the configuration described above, the fluxgate sensor 6 is accommodated in the first magnetic core 10.

The second magnetic core 20 is formed by ferrite. The second magnetic core 20 is formed in a torus shape. The second magnetic core 20 is formed in a thin plate shape in a central axial direction of the magnetic core 1. The second magnetic cores 20 are provided in pairs. The pair of the second magnetic cores 20 are respectively arranged outside of the first magnetic core 10 in a central axial direction.

Surfaces of the second magnetic core 20 other than a surface facing the first magnetic core 10 are exposed from the first magnetic core 10. As described above, the second magnetic core 20 can be assembled with the first magnetic core 10 from the outside, so that the second magnetic core 20 is partially exposed from the first magnetic core 10. With the configuration described above, the structure of the magnetic core 1 can be simplified, so that a production cost of the magnetic core 1 can be reduced, as compared with a case where the second magnetic core 20 is not exposed completely from the first magnetic core 10.

Alternatively, for example, as shown in the FIG. 3A, a groove 20a may also be formed in the second magnetic core 20, such that the first magnetic core 10 is fitted in the groove. Further, as shown in the FIG. 3B, a gap 10a may be formed in the first magnetic core 10, such that the second magnetic core 20 is fitted in the grooves. Therefore, one of the first magnetic core 10 and the second magnetic core 20 may be capable of being attached to another from the outside, such that the one is partially exposed from the another.

The third magnetic core 30 is formed by a dust core material, which is manufactured by compacting powder of a magnetic core material. The third magnetic core 30 is formed in the torus shape. The third magnetic core 30 is formed in a thin plate shape located in the central axial direction of the magnetic core 1. The third magnetic core 30 is provided in pairs. The pair of third magnetic cores are respectively stacked on the outsides of the second magnetic core 20 in the center axial direction.

As shown in FIG. 4, the frequency of the current flowing through the measuring object 9 is relatively low in the first frequency band. The first magnetic core 10 has a higher magnetic permeability than the second magnetic core 20 and the third magnetic core 30 in the first frequency band.

The second magnetic core 20 has a higher magnetic permeability than the first magnetic core 10 and the third magnetic core 30 in the second frequency band, which is higher than the first frequency band. Therefore, the first magnetic core 10 has a lower magnetic permeability than the second magnetic core 20 in the second frequency band. The third magnetic core 30 has a higher magnetic permeability than the first magnetic core 10 and the second magnetic core 20 in the third frequency band, which is higher than the second frequency band.

As shown in FIG. 1 and FIG. 2, the cover 5 is formed in a torus shape so as to cover the entire circumference of the magnetic core 1. The cover 5 has a first cover 5a and a second cover 5b which are divided in the central axial direction of the magnetic core 1. The first cover 5a and the second cover 5b are formed to have a U-shaped cross-section that is larger the magnetic core 1. The first cover 5a and the second cover 5b are formed in the same shape, and are attached to the magnetic core 1 with facing each other. A winding 7 is wound around the outer periphery of the cover 5. The cover 5 is made of a resinous material, for example, so as to insulate between the magnetic core 1 and the winding 7.

A pair of fluxgate sensors 6 is provided. The pair of fluxgate sensors 6 are stacked in the central axial direction of the magnetic core 1, while the fluxgate sensors 6 are accommodated in the first magnetic core 10. A detectable frequency band (a detectable band), where the fluxgate sensor 6 can detect the magnetic flux, is closest to the first frequency band. Providing the fluxgate sensor 6 makes it possible to detect not only the magnitude of A/C current but also that of D/C current. Leads 6a of the fluxgate sensor 6 are pulled out from the magnetic core 1, as shown in FIG. 1.

The first magnetic core 10 is arranged in a sensing area of the fluxgate sensor 6. In other words, the magnetic core having the highest magnetic permeability among the first magnetic core 10, the second magnetic core 20, and the third magnetic core 30 in the detectable band of the fluxgate sensor 6 is arranged in the sensing area of the fluxgate sensor 6. With the configuration described above, it is possible to more accurately detect the magnitude of D/C current by the fluxgate sensor 6, as compared with a case in which the magnetic core having a lower magnetic permeability in the detectable band of the fluxgate sensor 6 is arranged in the sensing area of the fluxgate sensor 6.

The outer periphery of the fluxgate sensor 6 is surrounded by the first magnetic core 10. In other words, the outer periphery of the fluxgate sensor 6 is surrounded by the magnetic core having the highest magnetic permeability among the first magnetic core 10, the second magnetic core 20, and the third magnetic core 30 in the detectable band of the fluxgate sensor 6. With the configuration described above, the magnetic core having the higher magnetic permeability among the first magnetic core 10 and the second magnetic core functions as a magnetic shield. Therefore, it is possible to prevent the fluxgate sensor 6 from detecting the magnetic flux from other than measuring object 9. As described above, the fluxgate sensor 6 can detect the magnitude of D/C current with high accuracy.

The winding 7 is wound in a poloidal direction along a toroidal direction with respect to the magnetic core 1. It is possible to improve the accuracy for mearing the current by providing the winding 7, as compared with a current sensor in which the negative feedback operation is not performed, which example is a current sensor using a Hall element. In FIG. 1, only a part of the winding 7 is shown in order to make it easy to understand the configuration of the current sensor 100. In actual configuration, the winding 7 is provided around the entire circumference of the magnetic core 1 in the toroidal direction.

During a current is being measured, a current flowing in the winding 7 generates a magnetic flux, which cancels a magnetic flux generated by the current flowing in the measuring object 9. The current sensor 100 has a shunt resistor (not shown) in which the current flowing through winding 7 flows. The current sensor 100 detects the magnitude of the current flowing through the measuring object 9, based on the magnitude of the voltage generated between the both ends of the shunt resistor.

The operation of the current sensor 100 will be described by referring to FIG. 4 mainly.

As shown in FIG. 4, in the first frequency band, where the frequency of the current flowing through the measuring object 9 is relatively low, the magnetic permeability of the first magnetic core 10 is higher than that of the second magnetic core 20 and the third magnetic core 30. Therefore, it is possible to accurately measure the magnitude of the current flowing through the measuring object 9 in the first frequency band, because the magnetic flux flows in the first magnetic core 10.

Furthermore, in the second frequency band with a higher frequency than the first frequency band, the magnetic permeability of the second magnetic core 20 is higher than that of the first magnetic core 10 and the third magnetic core 30. Therefore, it is possible to accurately measure the magnitude of the current flowing through the measuring object 9 in the second frequency band, because the magnetic flux flows in the second magnetic core 20.

In the third frequency band with a higher frequency than the second frequency band, the magnetic permeability of the third magnetic core 30 is higher than that of the first magnetic core 10 and the second magnetic core 20. Therefore, it is possible to accurately measure the magnitude of the current flowing through the measuring object 9 in the third frequency band, because the magnetic flux flows in the third magnetic core 30.

The current sensor 100 is required to have a measurement accuracy for outputting the same measurement values regardless of the position of the measuring object 9 located anywhere in the inner circumference of the magnetic core 1. However, when the magnetic permeability of the magnetic core 1 is low, a change of a characteristic for gain (phase)—frequency depending on a location of the measuring object 9 becomes large, and a hysteresis loss and an eddy current loss are increased.

Because the magnetic flux flows more while the magnetic permeability of the magnetic core 1 is higher, it is possible to measure the magnitude of the current with high accuracy. However, there is no magnetic material having a high magnetic permeability in a wide frequency band. Generally, a magnetic material having higher magnetic permeability in a relatively low frequency band has a lower magnetic permeability at a relatively high frequency band. A magnetic material having higher magnetic permeability in a relatively high frequency band has a lower magnetic permeability at a relatively low frequency band.

Therefore, when the magnetic core 1 is composed of only the first magnetic core 10, the values that is measured in the second frequency band and the third frequency band vary depending on the location of the measuring object 9 in the inner circumference of the magnetic core 1, such that the measuring accuracy is deteriorated. Similarly, when the magnetic core 1 is composed of only the second magnetic core 20, the values that is measured in the first frequency band and the third frequency band vary depending on the location of the measuring object 9 in the inner circumference of the magnetic core 1, such that the measuring accuracy is deteriorated.

On the other hand, the magnetic core 1 having the first magnetic core 10, the second magnetic core 20, and the third magnetic core 30 is employed in the current sensor 100. With the configuration described above, it is possible to secure the measurement accuracy for outputting the same measurement value, regardless of the position of the measuring object 9 in the inner circumference of the magnetic core, in a wide frequency band from the first frequency band to the third frequency band.

As described above, the magnetic core 1 has the first magnetic core 10 and the second magnetic core 20, which are arranged magnetically in parallel. In the first frequency band, where the frequency of the current flowing through the measuring object 9 is relatively low, the magnetic permeability of the first magnetic core 10 is higher than that of the second magnetic core 20. In the second frequency band higher than the first frequency band, the magnetic permeability of the second magnetic core 20 is higher than that of the first magnetic core 10. Therefore, the accuracy for measuring the current can be improved by the first magnetic core 10 in the first frequency band, and the accuracy for measuring the current can be improved by the second magnetic core 20 in the second frequency band. Therefore, it is possible to improve the accuracy for measuring the current in a wide frequency band by the current sensor 100.

The number of magnetic cores may be three or more. In other words, the magnetic core 1 includes the first magnetic core 10 to a "N"th magnetic core, while each magnetic core is arranged magnetically in parallel. "N" represents a natural number of 3 or more. In the first frequency band, the magnetic permeability of the first magnetic core 10 is higher than that of those from the second magnetic core 20 to the "N"th magnetic core. In the "n"th frequency band, while "n" represents a natural number from "2" to "N−1", the magnetic permeability of the "n"th magnetic core is higher than the magnetic permeability of those from the first magnetic core 10 to the "n−1"th magnetic core, and is higher than the magnetic permeability of those from the "n+1"th magnetic core to the "N"th magnetic core. In a "N"th frequency band, the magnetic permeability of the "N"th magnetic core is higher than the magnetic permeability of those from the first magnetic core 10 to the "N−1"th magnetic core. The current sensor 100 detects the magnitude of the current in a frequency band, in which the first frequency band to the "N"th frequency band are combined.

According to the configuration described above, the measurement accuracy of the current can be improved by the first magnetic core 10 in the first frequency band, and the measurement accuracy of the current can be improved by the "n"th magnetic core in the "n"th frequency band. "n" represents a natural number from "2" to "N". Therefore, it is possible to improve the measuring accuracy of the current in a wider frequency band by increasing the number of the magnetic cores provided magnetically in parallel.

Next, the current sensor 100 according to the first to fourth modifications will be described by referring to FIG. 5 to FIG. 9. In each of the modification described below, differences from the above-described embodiment are mainly described, and components having similar functions are denoted by the same reference numerals and descriptions thereof are omitted.

Figure 5:
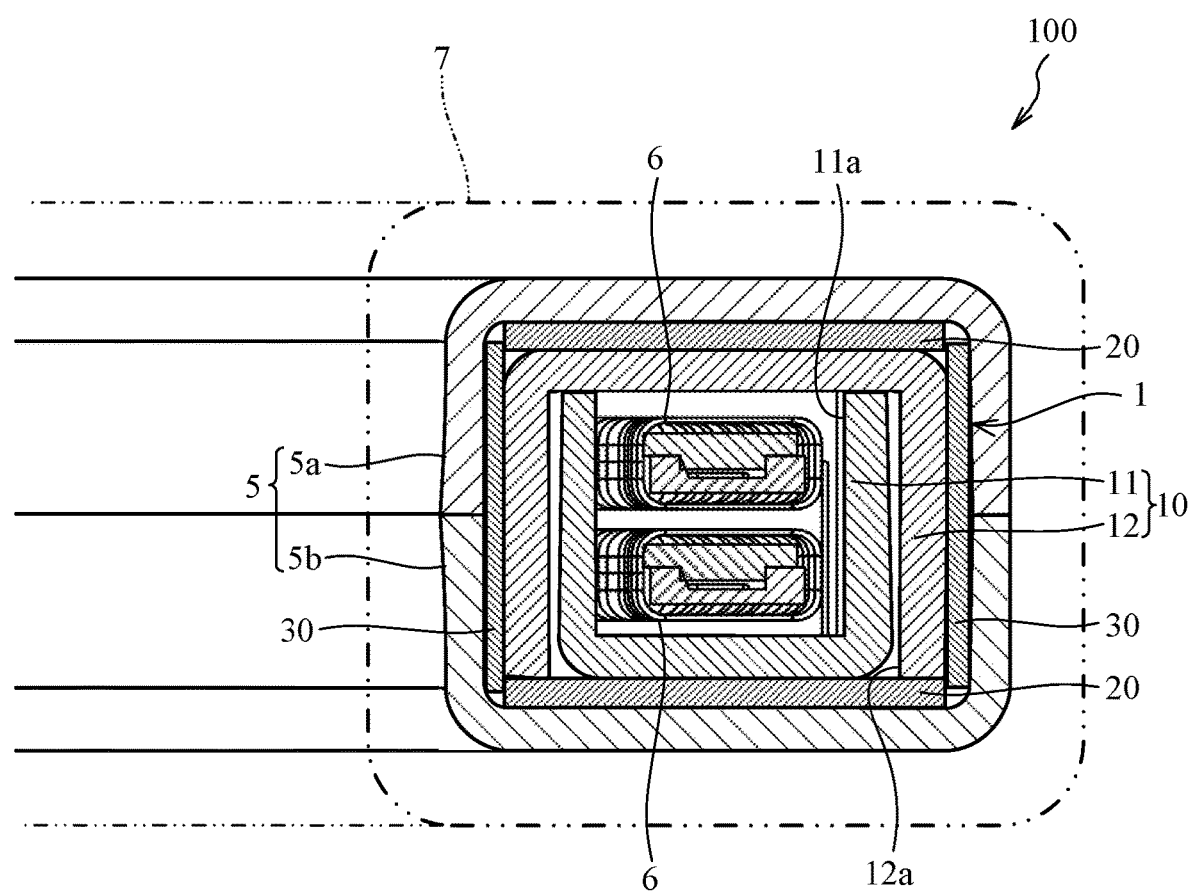
FIG. 5 is a cross-sectional view of the current sensor according to a first modification.

First, a current sensor 100 according to a first modification will be described by referring to FIG. 5. FIG. 5 is a cross-sectional view of the current sensor 100 according to the first modification.

In the first modification, the current sensor 100 differs from that in the above embodiment in a form and an arrangement of the third magnetic core 30.

As shown in FIG. 5, the third magnetic core 30 is formed in a thin plate shape in a radial direction of the magnetic core 1. The third magnetic cores 30 are provided in pairs. The pair of the third magnetic cores 30 are arranged in inner and outer peripheries of the first magnetic core 10, respectively.

With the configuration of the current sensor 100 according to the first modification described above, because the first magnetic core 10, the second magnetic core 20, and the third magnetic core 30 are magnetically arranger in parallel in the inner circumference of the winding 7, the same operation and effects as those of the above embodiment are obtained.

Figure 6:
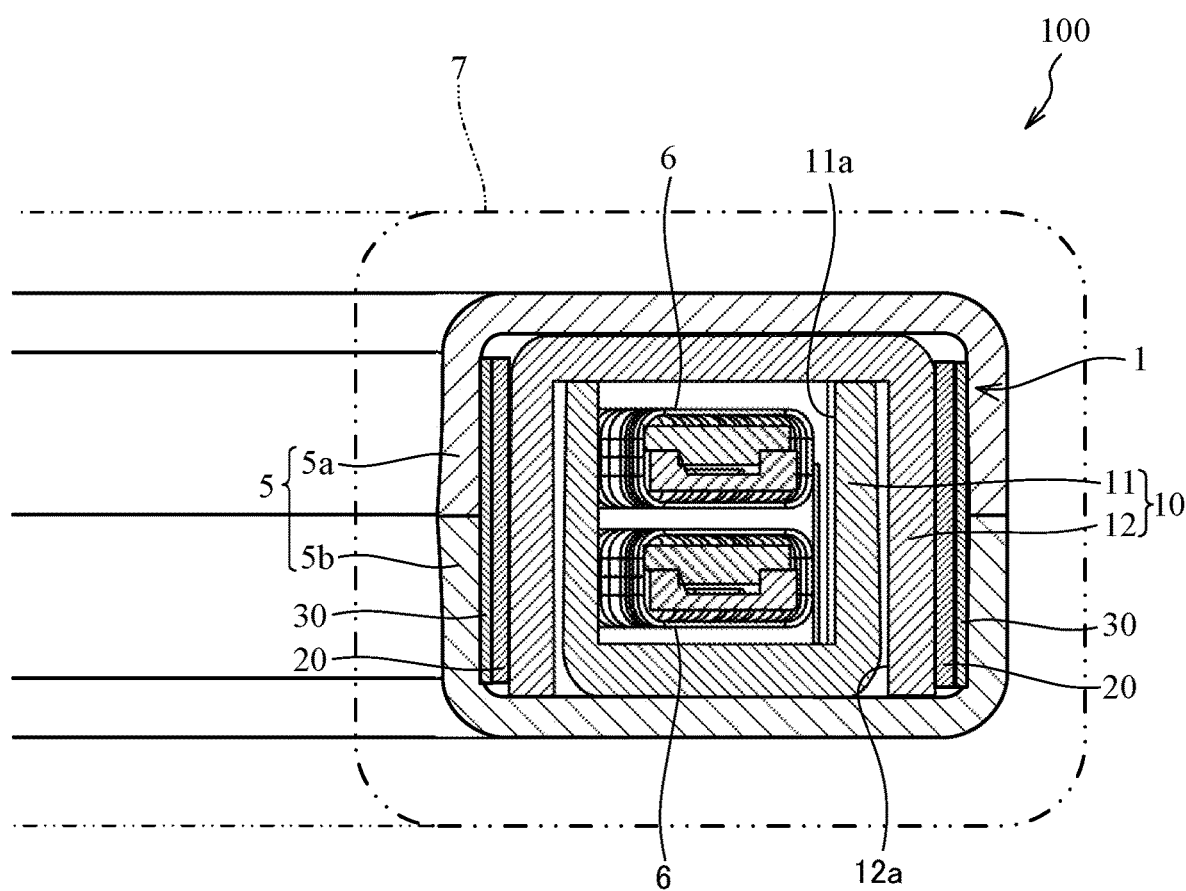
FIG. 6 is a cross-sectional view of the current sensor according to a second modification.

Next, referring to FIG. 6, current sensor 100 according to the second modification will be described. FIG. 6 is a cross-sectional view of a current sensor 100 according to a second modification.

The current sensor 100 according to the second modification differs from the above embodiment in the shape and arrangement of the second magnetic core 20 and the third magnetic core 30.

As shown in FIG. 6, the second magnetic core 20 is formed in a thin plate shape in a radial direction of the magnetic core 1. The second magnetic cores 20 are provided in pairs. The pair of the second magnetic cores 20 are arranged in inner and outer peripheries of the first magnetic core 10, respectively.

The third magnetic core 30 is formed in a thin plate shape in a radial direction of the magnetic core 1. The third magnetic cores 30 are provided in pairs. The pair of the third magnetic cores 30 are respectively stacked on the inner circumference of the inner side of the pair of the second magnetic cores 20 and on the outer circumference of the outer side of the pair of the second magnetic cores 20.

In the current sensor 100 according to the second modification described above, because the first magnetic core 10, the second magnetic core 20, and the third magnetic core 30 are arranged magnetically in parallel in the inner circumference of the winding 7, the same operation and effects as those of the above embodiment are obtained.

Figure 7:
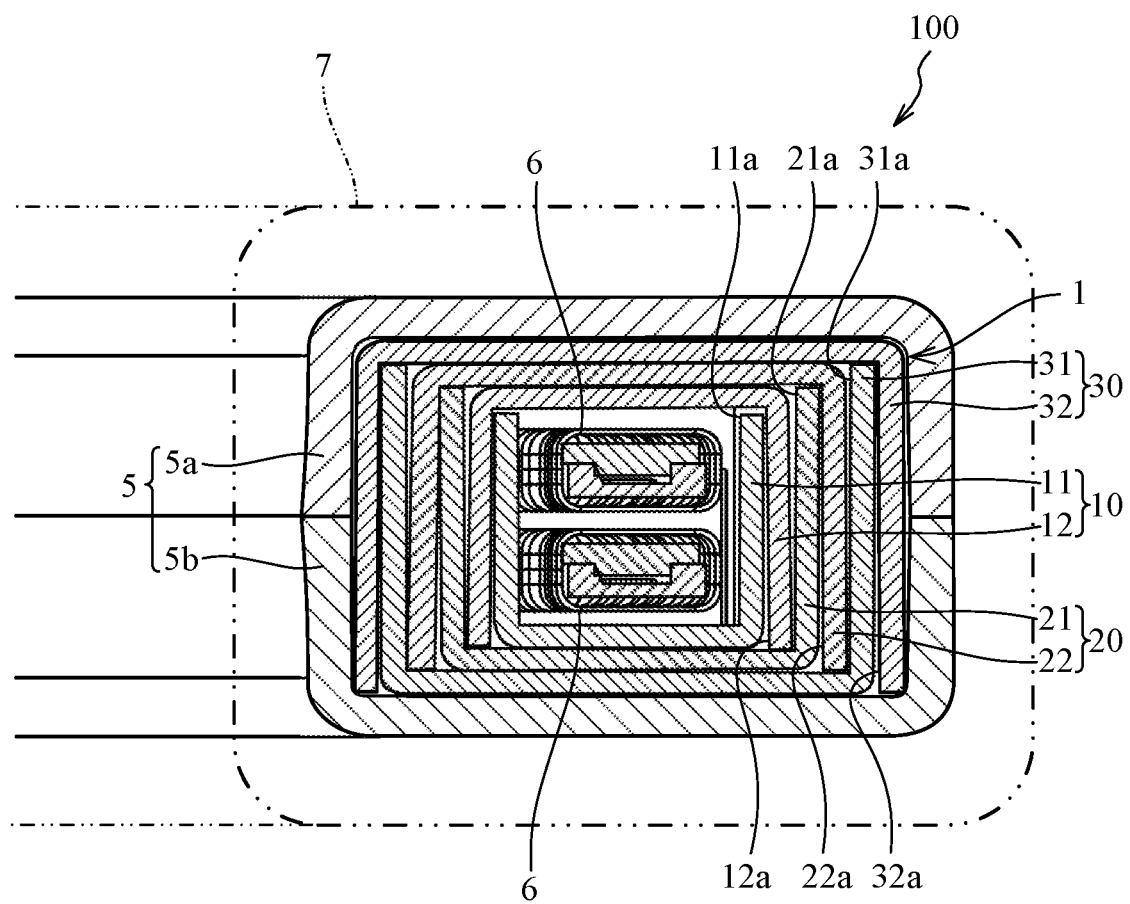
FIG. 7 is a cross-sectional view of the current sensor according to a third modification.

Next, a current sensor 100 according to a third modification will be described by referring to FIG. 7. FIG. 7 is a cross-sectional view of the current sensor 100 according to the third modification.

The current sensor 100 according to the third modification differs from the above embodiment in the shapes and arrangements of the second magnetic core 20 and the third magnetic core 30.

As shown in FIG. 7, the second magnetic core 20 has a small diameter case 21 and a large diameter case 22, similarly to the first magnetic core 10.

The small diameter case 21 is formed to have a U-shaped cross section larger than that of the first magnetic core 10. The small diameter case 21 has an opening 21a having a torus shape that opens to allow the first magnetic core 10 to be inserted. The small diameter case 21 accommodates the first magnetic core 10.

The large diameter case 22 is formed to have a U-shaped cross section larger than that of the small diameter case 21. The large diameter case 22 has an opening 22a having a torus shape that opens to allow the small diameter case 21 to be inserted. The large diameter case 22 is assembled with the small diameter case 21 by moving the opening 22a from a position facing the opening 21a of the small diameter case 21 along the center axial direction of the magnetic core 1. The large diameter case 22 closes the opening 21a of the small diameter case 21 in a state that the large diameter case 22 is assembled with the small diameter case 21. Therefore, the first magnetic core 10 is accommodated in the second magnetic core 20.

The second magnetic core 20 is provided on the outer periphery of the first magnetic core 10. Alternatively, the first magnetic core 10 provided on the outer periphery of the second magnetic core 20 is applicable. In other words, one of the first magnetic core 10 and the second magnetic core 20 is provided outside so as to surround the outer periphery of the other. With the configuration described above, a magnetic symmetry for the magnetic core 1, which covers the outer periphery, can be provided as viewed from the outer periphery. Therefore, it is possible to measure the magnitude of the D/C current by the fluxgate sensor 6 with high accuracy.

The third magnetic core 30 has a small diameter case 31 and a large diameter case 32, similarly to the first magnetic core 10 and the second magnetic core 20.

The small diameter case 31 is formed to have a U-shaped cross section larger than that of the second magnetic core 20. The small diameter case 31 has an opening 31a having a torus shape that opens to allow the second magnetic core 20 to be inserted. The small diameter case 31 accommodates the second magnetic core 20.

The large diameter case 32 is formed to have a U-shaped cross section larger than that of the small diameter case 31. The large diameter case 32 has an opening 32a having a torus shape that opens to allow the small diameter case 31 to be inserted. The large diameter case 32 is assembled with the small diameter case 31 by moving the opening 32a from a position facing the opening 31a of the small diameter case 31 along the center axial direction of the magnetic core 1. The large diameter case 32 closes the opening 31a of the small diameter case 31 in a state that the large diameter case 32 is assembled with the small diameter case 31. With the configuration described above, the second magnetic core 20 is accommodated in the third magnetic core 30.

In the current sensor 100 according to the third modification described above, because the first magnetic core 10, the second magnetic core 20, and the third magnetic core 30 are arranged magnetically in parallel in the inner circumference of the winding 7, the same operation and effects as those of the above embodiment are obtained.

In addition, the first magnetic core 10 and the second magnetic core 20 can be arranged symmetrical as viewed from the outer periphery of the third magnetic core 30 covering the outer periphery. Therefore, it is possible to measure the magnitude of D/C current by the fluxgate sensor 6 with high accuracy.

Figure 8:
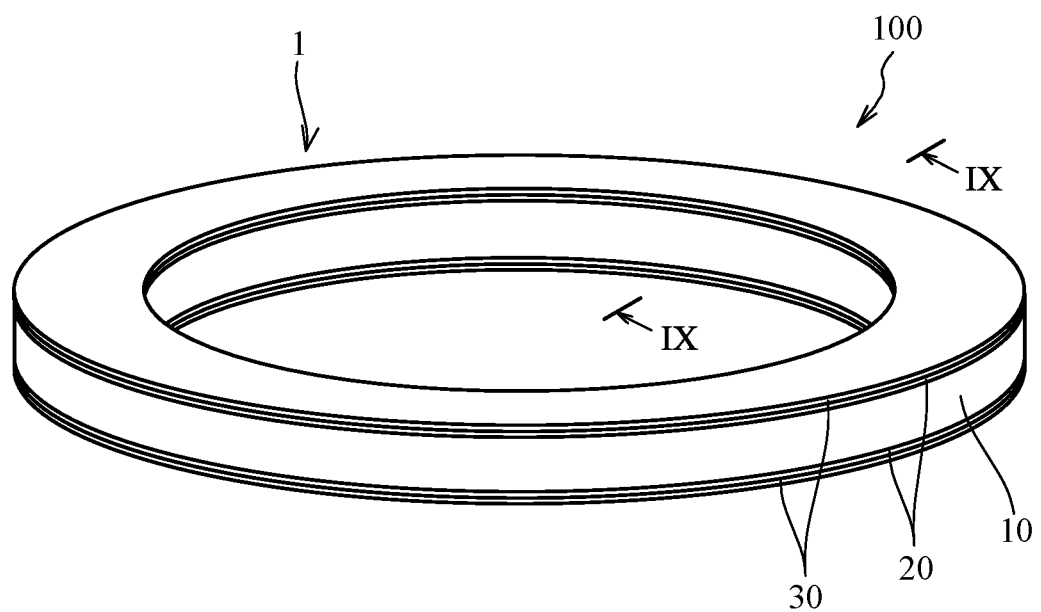
FIG. 8 is a perspective view of a magnetic core in the current sensor according to a fourth modification.
Figure 9:
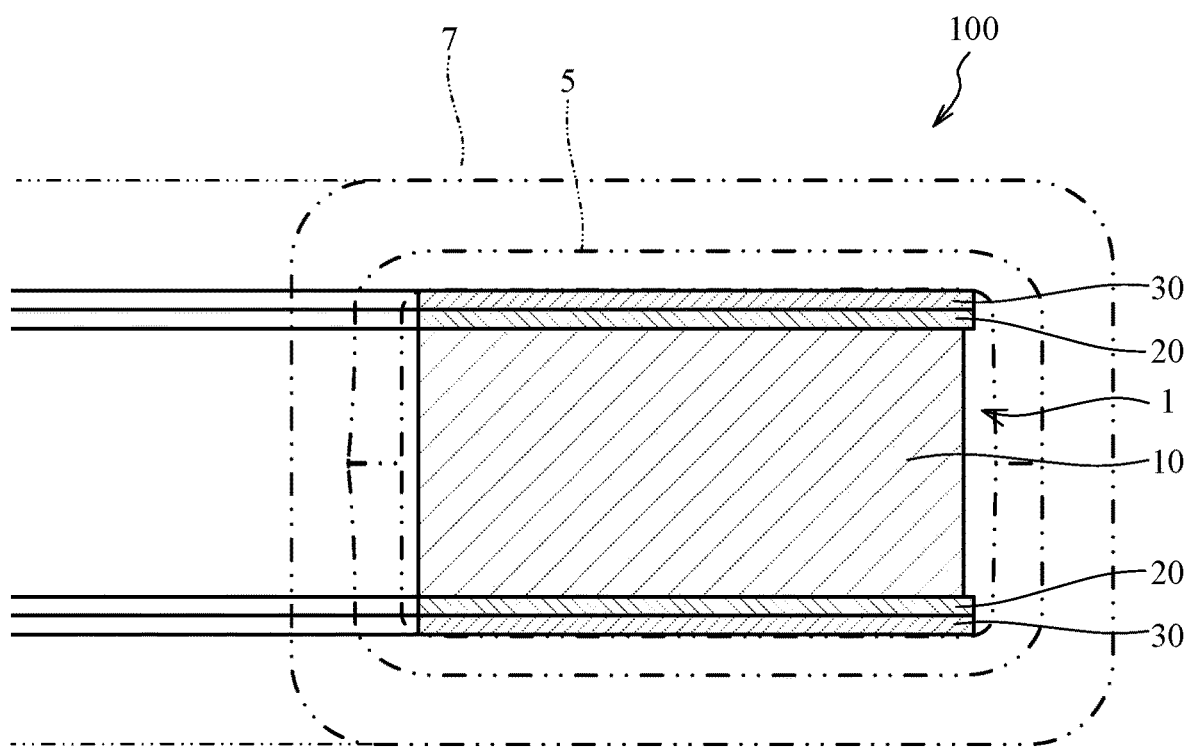
FIG. 9 is a IX-IX cross-sectional view in FIG. 8.

Next, a current sensor 100 according to a fourth modification will be described by referring to FIG. 8 and FIG. 9. FIG. 8 is a perspective view of a magnetic core 1 in current sensor 100 according to the fourth modification. FIG. 9 is a IX-IX cross-sectional view in FIG. 8.

The current sensor 100 according to the fourth modification is different from the above embodiment in that the current sensor 100 does not have the fluxgate sensor 6 and is a current sensor capable of measuring only the size of A/C current by CT (Current Transformer) type.

As shown in FIG. 9, the first magnetic core 10 is formed in a torus shape. The first magnetic core 10 is formed thicker than the second magnetic core 20 and the third magnetic core 30, in the central axial direction of the magnetic core 1.

The second magnetic core 20 is formed in a plate shape having thinness in the central axial direction of the magnetic core 1. The second magnetic cores 20 are provided in pairs and are disposed outward of the first magnetic core 10 in the center axial direction.

The third magnetic core 30 is formed in a plate shape having thinness in the central axial direction of the magnetic core 1. The third magnetic cores 30 are provided in pairs and stacked on the outer sides of the second magnetic core 20 in the center axial direction.

In the current sensor 100 according to the fourth modification described above, the first magnetic core 10, the second magnetic core 20, and the third magnetic core 30 are arranged magnetically in parallel on the inner circumference of the winding 7. Therefore, the same operation and effects as those of the above embodiment are obtained.

According to the above embodiment, the following effects are obtained.

A current sensor 100 for detecting the magnitude of the current flowing through the measuring object 9 includes the magnetic core 1. The magnetic core 1 includes the first magnetic core 10 and the second magnetic core 20, which is arranged magnetically in parallel with the first magnetic core 10.

The first magnetic core 10 has a higher magnetic permeability than the second magnetic core 20 in the first frequency band. The second frequency band higher than the first frequency band has a lower magnetic permeability than the second magnetic core 20. The magnitude of the current in the frequency band, in which the first frequency band and the second frequency band are combined, is detected.

With the configuration described above, the magnetic core 1 has the first magnetic core 10 and the second magnetic core 20 which are arranged magnetically in parallel. In the first frequency band, where a frequency of the current flowing through the measuring object 9 is relatively low, the magnetic permeability of the first magnetic core 10 is higher than that of the second magnetic core 20. In the second frequency band higher than first frequency band, the magnetic permeability of the second magnetic core 20 is higher than that of the first magnetic core 10. Therefore, in the first frequency band, it is possible to improve the measuring accuracy of the current by the first magnetic core 10. In the second frequency band, it is possible to improve the measuring accuracy of the current by the second magnetic core 20. Therefore, it is possible to improve the accuracy of measuring the current in a wide frequency band by the current sensor 100.

The first magnetic core 10 and the second magnetic core 20 are formed as magnetic cores in a ring shape through which the measuring object 9 is inserted.

With the configuration described above, the magnetic core 1 having the first magnetic core 10 and the second magnetic core 20 is formed in a ring shape. Therefore, it is possible to secure the measurement accuracy for outputting the same measurement values, regardless of the position of the measuring object 9 in the inner circumference of the magnetic core 1.

The current sensor 100 further includes the winding 7 wound in the poloidal direction along the toroidal direction with respect to magnetic core 1.

According to this configuration, it is possible to improve the measurement accuracy of the current by providing winding 7, as compared with a current sensor, an example of which is a current sensor using a Hall element, not performing a negative feedback operation by the winding.

In addition, one of the first magnetic core 10 and the second magnetic core 20 can be assembled to the other from the outside, so that the one is partially exposed from the other.

According to this configuration, because the structure of the magnetic core 1 can be simplified, it is possible to reduce the manufacturing cost of the magnetic core 1.

One of the first magnetic core 10 and the second magnetic core 20 is provided outside of the another so as to surround the outer periphery of the another.

With the configuration described above, symmetry for the first magnetic core 10 and the second magnetic core 20 can be provided as viewed from the outer periphery. Therefore, it is possible to measure the magnitude of D/C current by the fluxgate sensor 6 with high accuracy.

In addition, the current sensor 100 further includes the fluxgate sensor 6 as a magnetic detection element. One of the first magnetic core 10 and the second magnetic core 20 having higher magnetic permeability than another in a detecting band by the fluxgate sensor 6 is arranged in a sensing area by the fluxgate sensor 6.

With the configuration described above, it is possible to measure the magnitude of D/C current by the fluxgate sensor 6 with high accuracy.

In addition, one of the first magnetic core 10 and second magnetic core 20 having the higher magnetic permeability in the detecting band by the fluxgate sensor 6 surrounds the outer periphery of the fluxgate sensor 6.

With the configuration described above, one of the first magnetic core 10 and the second magnetic core 20 having higher magnetic permeability functions as the magnetic shield. Therefore, it is possible to prevent the fluxgate sensor 6 from measuring the magnetic flux acting from other than the measuring object 9.

As described above, the fluxgate sensor 6 can detect the magnitude of D/C current with high accuracy.

Second Embodiment

A current sensor 300 according to the second embodiment will be described by referring to FIG. 10. In the second embodiment, only elements different from those of the first embodiment will be described, and the same reference numerals are given to the same or equivalent elements as those in the first embodiment, and description thereof will be omitted. The current sensor 300 according to the second embodiment differs from the current sensor 100 of the first embodiment in that the current sensor 300 is covered with an electric conductive layer. Specifically, the current sensor 300 differs from the current sensor 100 in that the current sensor 300 is covered with a shield 200. The electric conductive layer corresponds to something forming a layer having electrical conductivity. Examples of the electric conductive layer are a conductive film, a thin plate, a tape, a film, and conductive layer containing rubber and resin.

Figure 10:
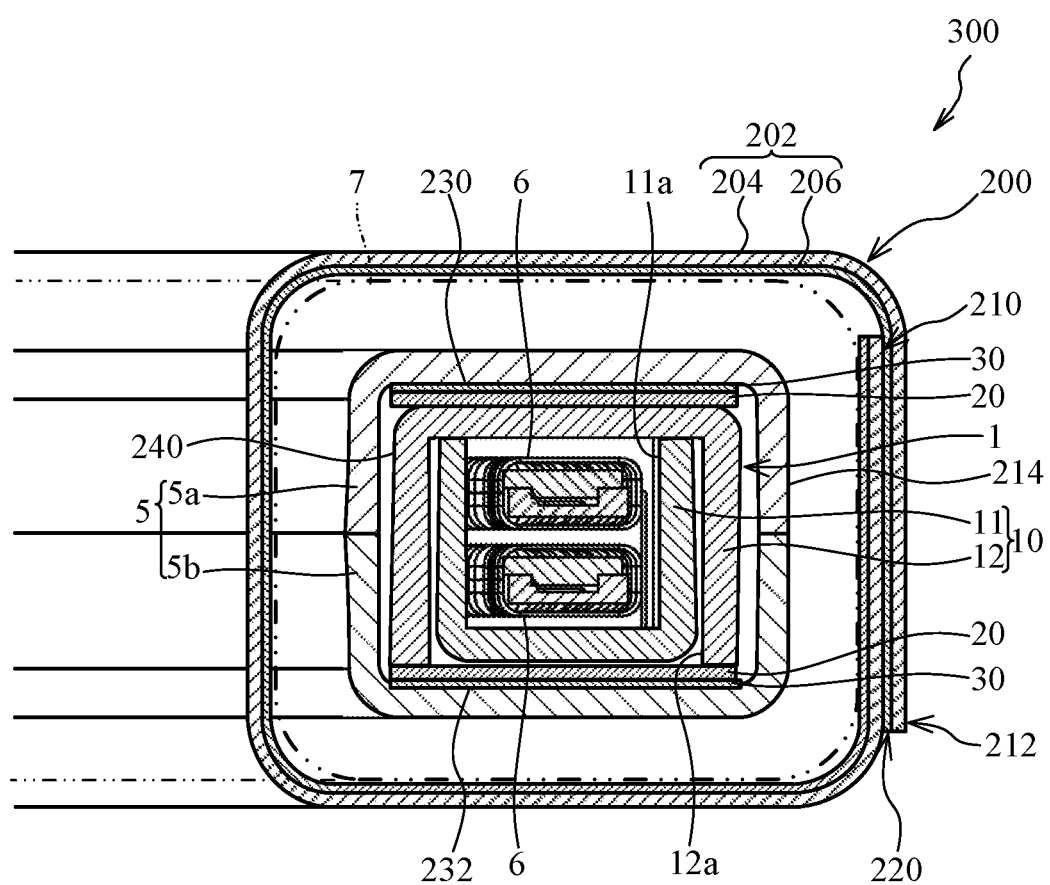
FIG. 10 is a view showing the current sensor according to a second embodiment of the present invention, which corresponds to the II-II cross section in FIG. 1.

FIG. 10 is a diagram showing the current sensor 300 according to the second embodiment of the present invention. FIG. 10 shows the diagram corresponding to the II-II cross section in FIG. 1. The current sensor 300 includes a cover 5 and a shield 200 which covers the winding 7 wound around the cover 5.

The shield 200 is composed of the electric conductive layer.

The electric conductive layer can be formed by extending a thin metal, by vapor deposition, or by plating. The metallic foil tapes can also be applied to form the electric conductive layer in the current sensor 300. In this embodiment, a metallic foil tapes are applied to form the shield 200 composed of the electric conductive layer.

Examples of metals used for the metallic foil tape are aluminum, stainless steel, copper, and the like. In the present embodiment, a copper foil tape 202 in a belt shaped, which has a copper-made foil, is applied.

The copper foil tape 202 is composed of a metallic layer 204 made of a copper foil to form the electric conductive layer, and an adhesion layer 206 laminated on a back surface of the metallic layer 204. The adhesion layer 206 is made of an insulator. The thickness dimension of the metallic layer 204 in the copper foil tape 202 is generally equal to or larger than 30 μm and equal to or smaller than 100 μm. In the present embodiment, the copper foil tape 202 having a thickness of 100 μm is applied, as an example of the thickness dimension of the metallic layer 204.

The shield 200 covering the current sensor 300 can be formed of the single copper foil tape 202 or a plurality of copper foil tapes 202 in strip-shapes.

In a case that the shield 200 is formed of the plurality of copper foil tapes 202 in the strip-shapes, each copper foil tape 202 is wound in the poloidal direction and attached while being shifted in the toroidal direction with respect to magnetic core 1, so that the adhesion layer 206 in the copper foil tape 202 is brought into close contact with the outer periphery of the wound winding 7. The copper foil tape 202 is wound in toroidal direction, so that one end portion 210 and another end portion 212 of the copper foil tape 202 overlap on an outer peripheral surface 214 of the cover 5, which is formed in the torus shape.

An insulated layer 220 is formed by the adhesion layer 206, which is composed of an insulator of the adhesion layer 206, between the metallic layer 204 in the one end portion 210 of the copper foil tape 202 and the metallic layer 204 in the another end portion 212. Therefore, in the copper foil tape 202, the one end portion 210 and the another end portion 212 are electrically insulated. With the configuration described above, it is possible to prevent the copper foil tape 202 from forming single-turn coil, so as to suppress an induced current generated by the magnetic flux from the measuring object 9.

The overlap margin, in which the one end portion 210 of the copper foil tape 202 and the another end portion 212 pile up, can be arbitrarily provided. The dimension of the insulated layer 220 between the metallic layer 204 of the one end portion 210 and the metallic layer 204 of the another end portion 212 can also be arbitrarily provided.

The longer the overlap margin, it is possible to suppress the change in the measured values, which is caused by the positions where the measuring object 9 is inserted into the current sensor 300. Furthermore, as the dimension of the insulated layer 220 is narrower, it is possible to suppress the change in the measured values, which is caused by the positions where the measuring object 9 is inserted into the current sensor 300.

The copper foil tape 202 is arranged with adjoining in the toroidal direction such that the side edges overlap, and therefore, it is possible to eliminate gaps that are provided in the toroidal direction. With the configuration described above, in the current sensor 300, the magnetic core 1 in the cover 5 and the winding 7 wound around the cover 5 are surrounded by the electric conductive layer, which is constituted by the metallic layer 204 of the copper foil tape 202.

On the other hand, when the shield 200 is formed by the single copper foil tape 202, the copper foil tape 202 is attached in a spiral shape, while the copper foil tape 202 is wound in the poloidal direction so as to be along the toroidal direction with respect to the magnetic core 1. The copper foil tape 202 is wound with overlapping the side edges thereof, and therefore, it is possible to eliminate gaps that are provided in the toroidal direction. With the configuration described above, in the current sensor 300, the cover 5 and the winding 7 wound around the cover 5 are surrounded by the electric conductive layer, which is constituted by the metallic layer 204 of the copper foil tape 202.

One end and the other end of the copper foil tape 202 in the length direction are not electrically connected. Therefore, it is possible to prevent the copper foil tape 202 from forming single-turn coil, so as to suppress an induced current generated by the magnetic flux from the measuring object 9.

According to the above embodiment, the following effects are obtained.

According to the present embodiment, the current sensor 300 detects the magnitude of the current flowing through the measuring object 9 using the magnetic core formed in a ring shape, while the measuring object 9 is inserted through the magnetic core. The current sensor 300 comprises a magnetic core 1 including the first magnetic core 10 and the second magnetic core 20, which is arranged magnetically in parallel with the first magnetic core 10. The First magnetic core 10 has a higher magnetic permeability than the second magnetic core 20 in the first frequency band, and has a lower magnetic permeability than the second magnetic core 20 in the second frequency band, which is higher than the first frequency band. The current sensor 300 detects the magnitude of the current in the frequency band, in which the first frequency band and the second frequency band are combined. The current sensor 300 is covered with the electric conductive layer.

With the configuration of the current sensor 300 according to this configuration, the same operation and effects can be obtained for the same portions as those of the first embodiment.

As described above, with the configuration of the current sensor 300 which detects the magnitude of the current flowing through the measuring object 9 using the magnetic core 1 formed in the ring shape, through which the measuring object 9 is inserted, it is possible to secure the measurement accuracy for outputting the same measurement value, regardless of the position of the measuring object 9 in the inner circumference of the magnetic core 1. However, it is known that, in a higher frequency of the current flowing through measuring object 9, the measuring accuracy deteriorates when the position of the measuring object 9 deviates from the center of the inner circumference of the magnetic core 1. Therefore, generally on an empirical basis, in order to prevent the deterioration of the measuring accuracy, the magnetic core 1 is covered entirely with the thicker metallic shields.

The inventors of the present application have experimentally found the following points. Firstly, the measuring accuracy deteriorates, when the magnetic flux other than the magnetic flux in the ring shape, which is generated in the ring shape around the outer periphery of the measuring object 9, intrudes into the magnetic core 1. Second, the shield 200 makes the effect to prevent the intrusion of the magnetic flux other the ring shaped, and the lower limit of the frequency, where the effort to prevent the intrusion is obtained, becomes higher, as the shield 200 is thinner in the thickness dimension. Third, in the frequency band where the magnetic core 1 has the magnetic permeability higher than air, even if the shield 200 is not provided, the effect by the intrusion of the magnetic flux other than the ring shaped is suppressed, because of the effect led by a collection of the magnetic flux by the magnetic core 1.

In the current sensor 300 according to the present embodiment based on the points above, the magnetic core 1 is covered with the shield 200. The shield 200 has a thinness such that the effect, which is to prevent the intrusion of the magnetic flux other than the ring shaped, becomes equal to or less than the threshold value, in the frequency equal to or less than the first frequency band. In the first frequency band, the magnetic permeability of the first magnetic core 10 is higher than that of the second magnetic core 20.

In the configuration described above, the magnetic core 1 is covered with the shield 200 having a thinness such that the effect, which prevents the intrusion of the magnetic flux other than the ring shaped, becomes equal to or less than the criterial effect in a frequency which is equal to or less than the first frequency band. In the first frequency band, the magnetic permeability of the first magnetic core 10 is higher than that of the second magnetic core 20. As a result, the shield 200 can be made thinner as compared with a shield 200 formed such that the effect, which prevents the intrusion of the magnetic flux other than the ring shaped, is larger than the criterial effect even in a frequency which is equal to or less than the first frequency band. Therefore, the current sensor 300 can be reduced in size and weight, and the current sensor 300 can be provided in an inexpensive price.

The effect, which prevents the intrusion of the magnetic flux other than the ring shaped, referred to herein (hereinafter, simply referred to as an intrusion prevention effect) may be one of the first order effect and the second order effect of the intrusion prevention effect. The intrusion prevention effect may be the second order effect caused by the intrusion prevention effect. An example of the second order effect is an effect to suppress a deterioration of the measuring accuracy, when the position of the measuring object 9 deviates from the center of the inner circumference of magnetic core 1.

A criterion for the intrusion prevention effect can be defined by a performance of the electric conductive layer (e.g., conductivity) in a frequency where one state, in which a target for the intrusion prevention effect is obtained, to another state, in which the target for the intrusion prevention effect is not obtained. For example, the criterion for the intrusion prevention effect can be defined by a specification for the measured value corresponding to the deviation of the position of the measuring object 9 from the center of magnetic core 1 (e.g., an allowable error for the current), a simulated result of the magnetic core 1, an experimental measured value (e.g., current value) obtained by gradually changing the thickness of the shield 200 of the current sensor.

In addition, with the configuration described above, it is possible to obtain the effect, even if a surface of the magnetic core 1 is covered by the shield 200, while the surface is positioned toward the insertion direction, such that the shield 200 covers only a part of the measuring object 9.

In the configuration of the present embodiment, the surface of the magnetic core 1 positioned toward the insertion direction of the measuring object 9 is covered by the conductive layer, which has the thinness such that the intrusion prevention effect of the magnetic flux other than the ring shaped is equal to or less than the criterion in a frequency which is equal to or less than the first frequency band. In the first frequency band, the magnetic permeability of the first magnetic core 10 is higher than that of the second magnetic permeability. However, when a plurality of the magnetic core arranged magnetically in parallel are combined, a frequency band, which has a magnetic permeability higher than that of air, can be expanded. As a result, the shield 200 can be formed thinner such that the intrusion prevention effect of the magnetic flux other than the ring shaped becomes equal to or less than the criterion in a frequency equal to or less than the frequency band. Therefore, the current sensor 300 can be further reduced in size, weight, and cost.

Furthermore, because the shield 200 can be made thinner, the shield 200 can be formed of a material having flexibility.

In the current sensor 300 according to the present embodiment, the electric conductive layer constituted by the copper foil tape 202 is formed in a belt shape, and is wound around the magnetic core 1. The insulated layer 220 made of the adhesion layer 206 is formed between the electric conductive layer overlapping with each other while being wound.

According to this configuration, in the copper foil tape 202 constituting the electric conductive layer, the one end portion 210 and the another end portion 212 are electrically separated from each other by the insulated layer 220. Therefore, it is possible to prevent the electric conductive layer, which is constituted by the copper foil tape 202, to prevent forming single-turn coil. With the configuration described above, in the copper foil tape 202 constituting the electric conductive layer, it is possible to suppress the generation of the induced current by the magnetic flux from the measuring object 9. Therefore, it is possible to improve the accuracy for measuring the current, as compared with when the induced current flows in the electric conductive layer constituted by the copper foil tape 202.

In the second embodiment, although the one end portion 210 and the another end portion 212 of the copper foil tape 202 are overlapped on the outer peripheral surface 214 of the cover 5, which is formed in the torus shape. However, the configuration in the present invention is not limited thereto. For example, a modification of the second embodiment described below may be applicable.

Figure 11:
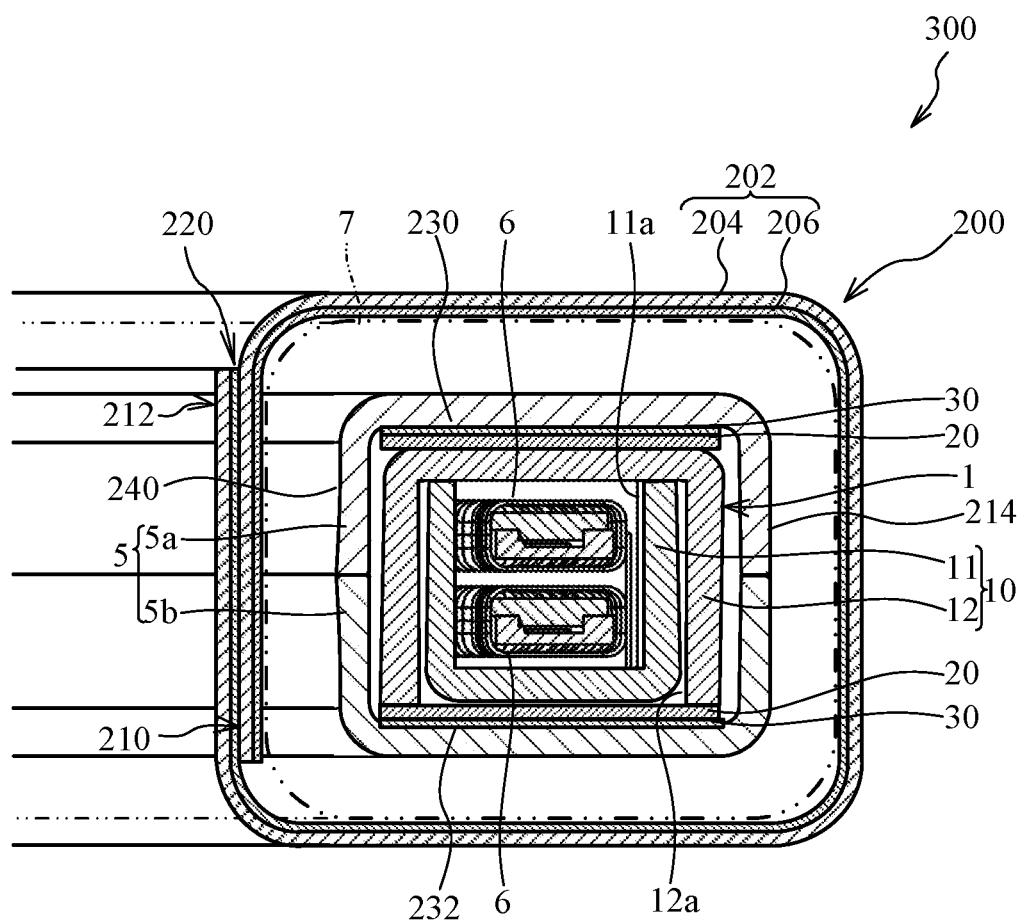
FIG. 11 is a cross-sectional view of the current sensor according to a modification of the second embodiment, which corresponds to the II-II cross-section in FIG. 1.

FIG. 11 is a cross-sectional view of a current sensor 300 according to a modification of the second embodiment, which corresponds to the II-II cross-section view in FIG. 1.

In the current sensor 300 according to the modification of the second embodiment, the one end portion 210 and the another end portion 212 of the copper foil tape 202 are overlapped on the inner peripheral surface 240 of the cover 5, which is formed in a torus shape.

With the configuration described above, the same operation and effect as those of the second embodiment can be obtained.

Third Embodiment

Next, a current sensor 400 according to a third embodiment will be described by referring to FIG. 12. In the third embodiment, only elements different from the second embodiment will be described, and the same reference numerals are given to the same or equivalent elements as those in the second embodiment, and description thereof will be omitted.

In the current sensor 400 according to the third embodiment differs from the current sensor 300 in the second embodiment in that a part of the current sensor 400 is covered with the electric conductive layer formed of the shield 200.

Figure 12:
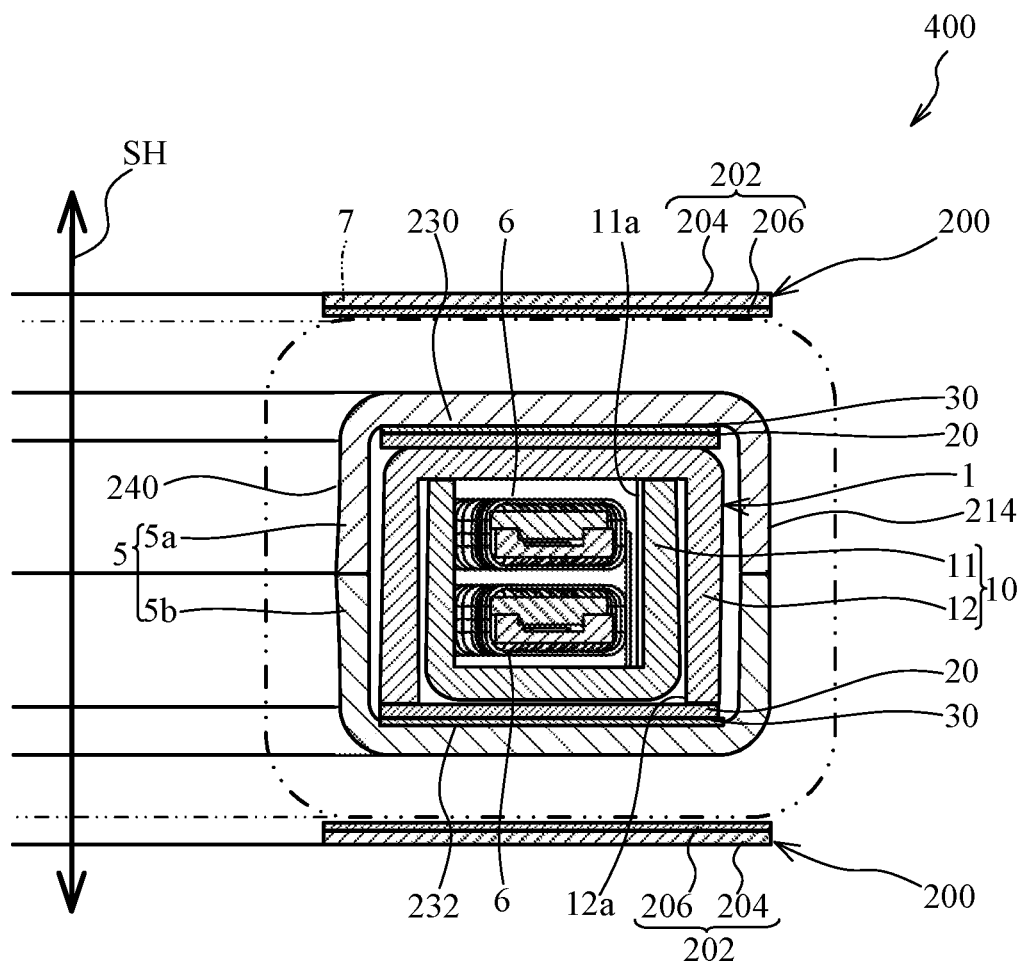
FIG. 12 is a view showing a current sensor according to a third embodiment of the present invention, which corresponds to the II-II cross section in FIG. 1.

FIG. 12 is a view showing the current sensor 400 according to the third embodiment of the present invention, which corresponds to the II-II cross section in FIG. 1. The current sensor 400 includes the cover 5, which covers the magnetic core 1, and a shield 200, which covers the winding 7 wound around the cover 5.

The shield 200 is formed so as to cover a one end surface 230 and another end face 232 of the magnetic core 1, which are located in an insertion direction SH of the measuring object 9 (see FIG. 1). The insertion direction SH of the measuring object 9 can be referred to as the center axial direction of the magnetic core 1 formed in the ring shape.

The shield 200 is composed of the copper foil tape 202 described above as one of the examples, and the copper foil tape 202 is affixed to the cover 5, which covers the magnetic core 1, and the winding 7, which is wound around the cover 5. With the configuration described above, the magnetic core 1 and the winding 7 are partially covered by the electric conductive layer formed by the copper foil tape 202.

Furthermore, the one end surface 230 and the another end surface 232, which are surfaces of the magnetic core 1 located in the insertion direction SH of the measuring object 9, are covered with the electric conductive layer.

According to the above embodiment, the following effects are obtained.

According to the present embodiment, the current sensor 400 detects the magnitude of the current flowing through the measuring object 9. The current sensor 400 has the magnetic core 1 including the first magnetic core 10 and the second magnetic core 20, which is arranged magnetically in parallel with the first magnetic core 10. The magnetic permeability of the first magnetic core 10 is higher than that of the second magnetic core 20 in the first frequency band, and is lower than that of the second magnetic core 20 in the second frequency band, which is higher than the first frequency band. The current sensor 400 detects the magnitude of the current in the frequency band, in which the first frequency band and the second frequency band are combined.

The first magnetic core 10 and the second magnetic core 20 are formed to be the magnetic core 1 in the ring shape, through which the measuring object 9 is inserted. The surfaces 230, 232 of the magnetic core 1, which are located in the insertion direction of the measuring object 9, are covered with the electric conductive layer.

According to the present embodiment, the current sensor 400 further includes the winding 7 which is wound in the poloidal direction along the toroidal direction with respect to the magnetic core 1. The electric conductive layer covers a part of the magnetic core 1 and the winding 7.

With the current sensor 400 having such the configuration, the same operation and effects can be obtained for the same portions as those of the first embodiment and the second embodiment.

As shown in the current sensor 400 of the present embodiment, the surfaces 230, 232 of the magnetic core 1, which are located in the insertion directions of the measuring object 9, are covered with the electric conductive layer (204), which is made of the metallic layer 204.

The inventors of the present application have found the point as follows. When the electric conductive layer located in the insertion directions of the measuring object 9 is provided, the effect by the electric conductive layer becomes larger, compared with when the electric conductive layer is provided in the directions other than the insertion directions.

As a result of providing the electric conductive layer described above, it is possible to suppress the magnetic flux entering to the magnetic core 1 from the one end surface 230 and the another end surface 232 of the magnetic core 1, among the magnetic flux formed by the current flowing through the measuring object 9. Therefore, the effect made by the magnetic flux entering the magnetic core 1 is suppressed on the measuring accuracy.

Even when the measuring object 9 is arranged with deviating from the center of magnetic core 1 formed in the torus shape, and when the measuring object 9 is close to a specific point in the magnetic core 1, it is possible to suppress the effect on the measuring accuracy, and to improve the measuring accuracy of the current.

In the third embodiment, the case where the one end surface 230 and the other end surface 232 of the magnetic core 1, which are located in the insertion directions SH of the measuring object 9, are covered with the electric conductive layer (204) is exemplified, but is not limited thereto. For example, it may be configured as in the fourth embodiment described below.

Fourth Embodiment

Next, a current sensor 500 according to the fourth embodiment will be described by referring to FIG. 13. In the fourth embodiment, only elements different from those of the second embodiment will be described, and the same reference numerals are given to the same or equivalent elements as those in the second embodiment, and description thereof will be omitted.

The current sensor 500 according to the fourth embodiment differs from the current sensor 300 in the second embodiment in that a part of current sensor 500 is covered with the electric conductive layer (204), which is formed by the shield 200.

Figure 13:
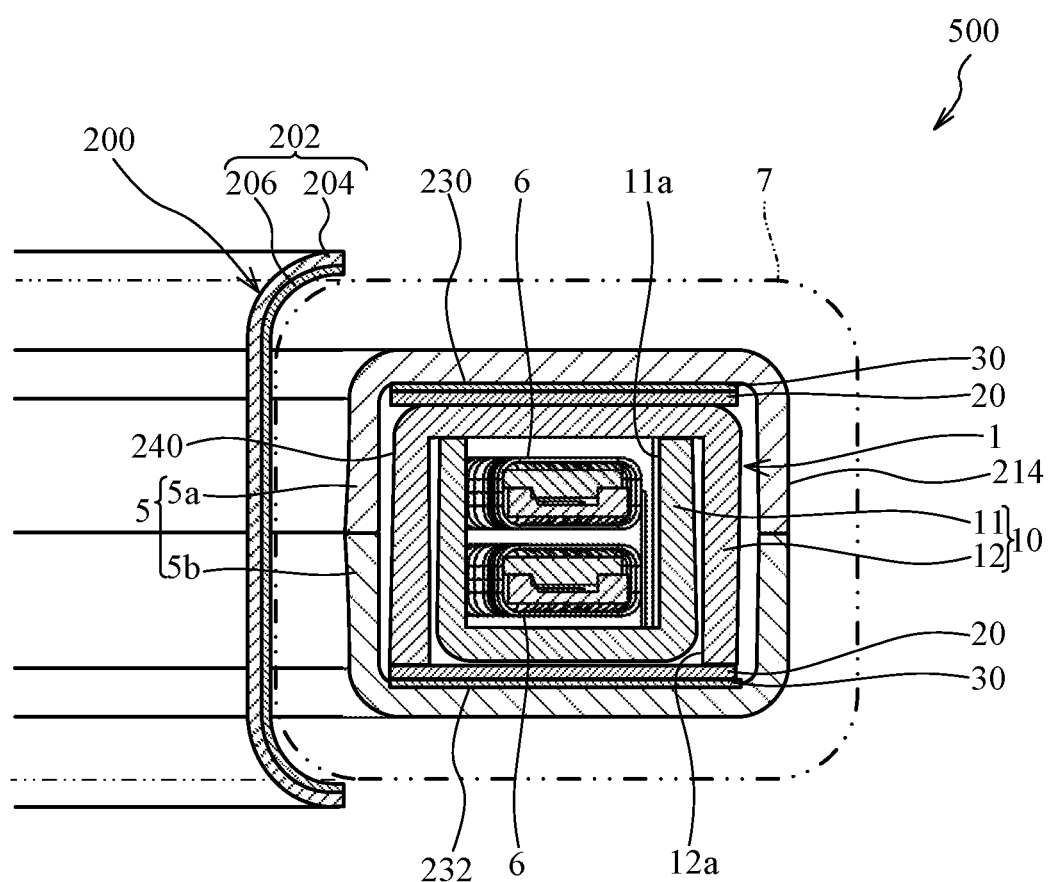
FIG. 13 is a view showing a current sensor according to a fourth embodiment of the present invention, which corresponds to the II-II cross section in FIG. 1.

FIG. 13 is a view showing the current sensor 500 according to the fourth embodiment of the present invention, and the view corresponds to the II-II cross section in FIG. 1. The current sensor 500 includes the cover 5, which covers the magnetic core 1, and a shield 200, which covers the winding 7 wound around the cover 5.

The shield 200 is provided so as to cover the inner peripheral surface 240 of the magnetic core 1. As a result of this configuration, the inner peripheral surface 240 of the magnetic core 1 formed in the ring shape is covered with the electric conductive layer (204).

The shield 200 is composed of the copper foil tape 202 described above, and the copper foil tape 202 is affixed to the winding 7, which is wound around the cover 5 covering the magnetic core 1, for example. Therefore, the magnetic core 1 and the winding 7 are partially covered by the metallic film formed by the copper foil tape 202.

According to the above embodiment, the following effects are obtained.

According to the present embodiment, the current sensor 500 detects the magnitude of the current flowing through the measuring object 9. The current sensor 500 has the magnetic core 1 including the first magnetic core 10 and the second magnetic core 20, which is arranged magnetically in parallel with the first magnetic core 10. The magnetic permeability of the first magnetic core 10 is higher than that of the second magnetic core 20 in the first frequency band, and lower than that of the second magnetic core 20 in the second frequency band, which is higher than the first frequency band. The current sensor 500 detects the magnitude of the current in the combined frequency band of the first frequency band and the second frequency band.

The first magnetic core 10 and the second magnetic core 20 are formed as the magnetic core 1 in the ring shape through which the measuring object 9 is inserted. The inner peripheral surface 240 of the magnetic core 1 in the ring shape is covered with the electric conductive layer.

The current sensor 500 in the present embodiment further includes the winding 7, which is wound in the poloidal direction along the toroidal direction with respect to the magnetic core 1. The electric conductive layer covers the magnetic core 1 and the winding 7.

The inventors of the present application have found that, when the electric conductive layer is provided on the inner peripheral surface of the measuring object, the electric conductive layer brings the effect, which is secondly effective after when the electric conductive layer is provided in the insertion direction of the measuring object.

Therefore, by the current sensor 500 even where the inner peripheral surface 240 of the magnetic core 1 in the ring shape is covered with the electric conductive layer, the same operation and effect can be achieved for the same parts as those of the configurations described in the first to the third embodiments.

In the second to the fourth embodiments, the structures of the shield 200 described above are applied to the current sensor 100 in the first embodiment, but is not limited thereto. The structures of the shield 200 in the second to the fourth embodiments may be applied to the current sensor 100 of the modification of the first embodiment, for example.

While the embodiments of the present invention have been described above, the above embodiment is only a part of the application example of the present invention, and the technical scope of the present invention is not intended to limit the technical scope of the present invention to the specific configuration of the above embodiment.

In the above embodiment, the magnetic core 1 includes the first magnetic core 10, the second magnetic core 20, and the third magnetic core 30, but is not limited thereto. The magnetic core 1, which includes a plurality of magnetic cores having different frequency characteristics, may be applicable.

For example, the magnetic core 1 may have only the first magnetic core 10 and the second magnetic core 20. The magnetic core 1 may have only the first magnetic core 10 and the third magnetic core 30. The magnetic core 1 may have only the second magnetic core 20 and the third magnetic core 30.

In addition, the magnetic core 1 may further include the fourth magnetic core (not shown) having different frequency characteristic, in addition to the first magnetic core 10, the second magnetic core 20, and the third magnetic core 30.

The current sensor 100 includes the winding 7 in the configuration above, however, the current sensor 100, which does not include the winding 7, may be applicable. Such current sensor 100 may have a magnetic core in an arc-shaped, in which a part of a torus shape is cut, and have a Hall element in the cut part, such that the current sensor measures the magnitude of the current flowing through the measuring object 9.

Further, the current sensor 100 is a through-type current sensor, but may be a divided type (clamping type) current sensor or the like instead of the through-type one.

The thickness of the shield 200 is not limited to 100 μm or less, and may be thicker than 100 μm.

In addition, the shield 200 is not limited to those which are attached or wound by a metallic foil. The shield 200 may be formed by evaporation or plating by the conductive material on a housing.

Further, the following effect can be obtained. The shield 200 formed by a metallic can be thinner than a shield formed of other materials having the same performance for the electromagnetic shield as the shield 200. The shield 200 formed by the metallic has a higher performance in shielding electromagnetic, because the shield 200 has a higher conductivity than other materials such that a damping loss is increased. Therefore, the shield 200, which is formed by the metallic, can be made thinner as compared with the shield which is formed of the other materials. Furthermore, the shield may be formed by copper or aluminum, which are examples of metallics having relatively higher conductivity among the other metallic. Such shield can be made thinner, and therefore an effect can be obtained.

In a frequency band where the magnetic core 1 has a magnetic permeability higher than that of air, even if no shield 200 is provided, an influence by the intrusion of the magnetic flux other than the ring shaped is reduced. The reduction of the influence is caused by the magnetism collecting effect by the magnetic core 1. However, the higher the magnetic permeability of magnetic core 1, the lower the influence caused by the intrusion of the magnetic fluxes other than the ring shape.

This application claims priority based on Japanese Patent Application No. 2020-039014 filed with the Japan Patent Office on Mar. 6, 2020 and Japanese Patent Application No. 2021-001731 filed with the Japan Patent Office on Jan. 7, 2021, the entire contents of which are incorporated into this specification by reference.

Description for Reference Numerals 100, 300, 400, 500 Current sensor
1 Magnetic core
6 Fluxgate sensor (magnetic detection element)
7 Winding
9 Measuring object
10 First magnetic core
20 Second magnetic core
30 Third magnetic core.
200 Shield
204 Metallic layer (electric conductive layer)
220 Insulating layer

What is claimed is:
1. A current sensor for detecting a magnitude of a current flowing through a measuring object, the current sensor comprising:
   a magnetic core comprising a first magnetic core and a second magnetic core that is arranged magnetically in parallel to the first magnetic core,
   wherein the first magnetic core has a magnetic permeability that is higher than that of the second magnetic core in a first frequency band, and the first magnetic core has a magnetic permeability that is lower than that of the second magnetic core in a second frequency band, the second frequency band being higher than the first frequency band, and the current sensor detects the magnitude of the current in a frequency band that is constituted by combining the first frequency band and the second frequency band.

2. The current sensor according to claim 1,
wherein the magnetic core comprises those from the first magnetic core to a "N"th magnetic core that are arranged magnetically in parallel with each other, "N" being a natural number equal to or larger than three,
the magnetic permeability of the first magnetic core is higher than any of magnetic permeabilities of those from the second magnetic core to the "N"th magnetic core, in the first frequency band, and
the magnetic permeability of a "n"th magnetic core is higher than any of magnetic permeabilities of those from the first magnetic core to a "n−1"th magnetic core, and is higher than any of magnetic permeabilities of those from a "n+1"th magnetic core to the "N"th magnetic core, in a "n"th frequency band, "n" being a natural number from two to "N−1",
the magnetic permeability of the "N"th magnetic core is higher than any of magnetic permeabilities of those from the first magnetic core to a "N−1"th magnetic core in a "N"th frequency band, and
the current sensor detects the magnitude of the current in a frequency band that is constituted by combining the first frequency band to the "N"th frequency band.

3. The current sensor according to claim 1,
wherein the magnetic core is formed in a ring shape through which the measuring object is inserted.

4. The current sensor according to claim 3,
wherein a surface of the magnetic core located in an insertion direction of the measuring object is covered with an electric conductive layer, the electric conductive layer having a thickness with which an intrusion prevention effect by a magnetic flux other than the magnetic flux in a ring shaped, is equal to or less than a criterion in a frequency that is equal to or less than the first frequency band.

5. The current sensor according to claim 3,
wherein a surface of the magnetic core located in an insertion direction of the measuring object is covered with an electric conductive layer, the electric conductive layer having a thickness with which an intrusion prevention effect by a magnetic flux other than the magnetic flux in a ring shaped, is equal to or less than a criterion in a frequency that equals to or less than a frequency band that is constituted by combining frequency bands of the first magnetic core and "N−1" number of "n"th magnetic cores.

6. The current sensor according to claim 3,
wherein an inner peripheral surface of the magnetic core is covered with an electric conductive layer, the electric conductive layer having a thickness with which an intrusion prevention effect by a magnetic flux other than the magnetic flux in a ring shaped is equal to or less than a criterion in a frequency that is equal to or less than the first frequency band.

7. The current sensor according to claim 3,
wherein an inner peripheral surface of the magnetic core is covered with an electric conductive layer, the electric conductive layer having a thickness with which an intrusion prevention effect by a magnetic flux other than the magnetic flux in a ring shaped is equal to or less than a criterion in a frequency that equals to or less than a frequency band that is constituted by combining frequency bands of the first frequency band and "N−1" number of "n"th magnetic cores.

8. The current sensor according to claim 4,
wherein the electric conductive layer is formed in a belt shape, the electric conductive layer being wound in a poloidally direction with respect to the magnetic core, and an insulating layer is formed between portions of the electric conductive layer overlapping in a wound state.

9. The current sensor according to claim 4, the current sensor further comprising a winding that is wound in a poloidal direction so as to be formed along a toroidal direction with respect to the magnetic core.

10. The current sensor according to claim 4,
the current sensor further comprising a winding that is wound in a poloidal direction such that being along with a toroidal direction with respect to the magnetic core,
wherein the electric conductive layer covers the magnetic core and the winding.

11. The current sensor according to claim 1,
wherein one of the first magnetic core and the second magnetic core can be assembled to another of the first magnetic core and the second magnetic core from an outside such that a part of the one of the first magnetic core and the second magnetic core is exposed from the another of the first magnetic core and the second magnetic core.

12. The current sensor according to claim 1,
one of the first magnetic core and the second magnetic core is provided outside of another of the first magnetic core and the second magnetic core so as to surround an outer periphery of the another of the first magnetic core and the second magnetic core.

13. The current sensor according to claim 1,
the current sensor further comprising a magnetic detection element,
wherein one of the first magnetic core and the second magnetic core, having a higher magnetic permeability than another of the first magnetic core and the second magnetic core in a detecting band by the magnetic detection element, is arranged in a sensing area of the magnetic detection element.

14. The current sensor according to claim 13,
wherein, the one of the first magnetic core and the second magnetic core having the higher magnetic permeability in the detecting band covers an outer periphery of the magnetic detection element.

* * * * *